(12) United States Patent
Kraus et al.

(10) Patent No.: US 8,911,561 B2
(45) Date of Patent: Dec. 16, 2014

(54) DEVICE AND METHOD FOR REMOVING LIQUID FROM A SURFACE OF A DISC-LIKE ARTICLE

(75) Inventors: Harald Kraus, Villach (AT); Axel Wittershagen, Villach (AT)

(73) Assignee: Lam Research AG, Villach (AT)

( * ) Notice: Subject to any disclaimer, the term of this patent is extended or adjusted under 35 U.S.C. 154(b) by 185 days.

(21) Appl. No.: 13/053,587

(22) Filed: Mar. 22, 2011

(65) Prior Publication Data

US 2011/0168213 A1 Jul. 14, 2011

Related U.S. Application Data

(62) Division of application No. 12/444,093, filed as application No. PCT/IB2007/055357 on Oct. 16, 2007.

(30) Foreign Application Priority Data

Oct. 2, 2006 (AT) .................................. A 1642/2006

(51) Int. Cl.
*H01L 21/67* (2006.01)

(52) U.S. Cl.
CPC .... *H01L 21/67034* (2013.01); *H01L 21/67051* (2013.01); *H01L 21/67028* (2013.01)
USPC .............................................. 134/32; 134/33

(58) Field of Classification Search
CPC .................. H01L 21/67034; H01L 21/67028; H01L 21/67051; B01B 1/04; B01B 3/024
USPC ...................................... 134/32, 33, 36, 36 B
See application file for complete search history.

(56) References Cited

U.S. PATENT DOCUMENTS

| 5,882,433 A | 3/1999 | Ueno |
| 6,247,479 B1 | 6/2001 | Taniyama et al. |

(Continued)

FOREIGN PATENT DOCUMENTS

| JP | 2002057088 | 2/2002 |
| JP | 2004095805 | 3/2004 |

(Continued)

OTHER PUBLICATIONS

International Search Report dated Jun. 20, 2008, from corresponding PCT application.

(Continued)

*Primary Examiner* — Nicole Blan
*Assistant Examiner* — Katelyn Whatley
(74) *Attorney, Agent, or Firm* — Young & Thompson

(57) ABSTRACT

A method for removing liquid from a surface of a disc includes, rotating the disc article about an axis perpendicular to the disc's main surface, supplying liquid from a supply port, moved across the substrate towards the edge of the disc, onto the rotated disc, supplying a first gas flow through a first gas supply port onto the disc article to an area whose center has a distance to the center of rotational movement of not more than 20 mm, the area being covered with a liquid layer thereby opening the liquid layer at a discrete area, and supplying a second gas flow through a second gas supply port moved across the substrate towards the edge of the substrate onto the rotated disc wherein the distance of the second gas supply port to the center is lower than the distance of the liquid supply port to the center.

8 Claims, 4 Drawing Sheets

(56) References Cited

U.S. PATENT DOCUMENTS

| | | | |
|---|---|---|---|
| 2004/0040177 A1 | 3/2004 | Izumi | |
| 2004/0060190 A1* | 4/2004 | Lee | 34/59 |
| 2005/0121059 A1* | 6/2005 | Boyd et al. | 134/102.3 |
| 2005/0241684 A1* | 11/2005 | Achkire et al. | 134/103.2 |
| 2006/0048792 A1 | 3/2006 | Nakamura et al. | |
| 2006/0081269 A1 | 4/2006 | Kim et al. | |
| 2006/0086373 A1* | 4/2006 | Park | 134/6 |

FOREIGN PATENT DOCUMENTS

| | | |
|---|---|---|
| JP | 2004119717 | 4/2004 |
| JP | 2005217226 | 8/2005 |
| JP | 2006245381 | 9/2006 |
| JP | 2007036180 | 2/2007 |

OTHER PUBLICATIONS

JP Office Action dated Mar. 6, 2012 from JP 2009531005.

* cited by examiner

DEVICE AND METHOD FOR REMOVING LIQUID FROM A SURFACE OF A DISC-LIKE ARTICLE

CROSS REFERENCE TO RELATED APPLICATIONS

This application is a new division of co-pending application Ser. No. 12/444,093 filed on Apr. 2, 2009, which is the 35 U.S.C. §371 national stage of International PCT/IB07/55357 filed on Oct. 16, 2007, which claims priority to Austrian Application No. A 1642/2006 filed on Oct. 2, 2006. The entire contents of each of the above-identified applications are hereby incorporated by reference.

FIELD OF THE INVENTION

The invention relates to a device for removing liquid from a surface of a disc-like article. More particularly the invention refers to a device for fluid treating a disc-like article to remove liquid from a surface.

RELATED ART

Several liquid removing methods are known in semiconductor industry. Many liquid removing methods use a defined liquid/gas boundary layer. Such liquid removing methods are better known as Marangoni drying methods.

U.S. Pat. No. 5,882,433 discloses a combined Marangoni spin drying method and a device therefore. Thereby deionised water is dispensed onto a wafer and simultaneously a mixture of nitrogen with 2-propanol is dispensed. The 2-propanol in the nitrogen shall influence the liquid/gas boundary layer in that a surface gradient shall occur, which leads to the effect that the water runs of the wafer without leaving any droplets on the wafer (Marangoni Effect). The gas dispenser directly follows the liquid dispenser while the liquid dispenser is moved from the centre to the edge of the wafer and while the wafer is spun and thereby gas directly displaces the liquid from the wafer.

This liquid removing method is however very difficult to control. E.g. the distance of the liquid dispenser to the gas dispenser, the temperature, the gas flow, and the liquid flow are critical parameters. Thus the process window is very narrow especially for disc-shaped articles of larger diameter such as 300 mm semiconductor wafers and flat panel displays as well as for semiconductor wafers, which have a higher integration e.g. 90 nm 65 nm device size.

Currently available devices, which are well designed to remove liquid from the inner region of a disc-like article, do not sufficiently remove liquid from the outer region. Once the design was modified to sufficiently remove liquid from the outer region with such design liquid can no longer be sufficiently removed from the inner region.

It is thus an object of the invention to provide an improved method for removing liquid from a large disc-like article e.g. a semiconductor wafer with a diameter larger than 200 mm.

SUMMARY OF THE INVENTION

The invention meets the objects by providing a device for removing liquid from a surface of a disc-like article comprising
  rotating means for holding and rotating one single disc-like article,
  a liquid dispensing means for dispensing liquid onto the disc-like article,
  a first gas dispensing means comprising at least one nozzle with orifice(s) for blowing gas onto the disc-like article,
  a second gas dispensing means comprising at least one nozzle with orifice(s) for blowing gas onto the disc-like article,
  moving means for moving the liquid dispensing means and the second gas dispensing means across the disc-like article so that the second gas dispensing and the liquid dispensing means move towards an edge region, and
  means for controlling the gas flows dispensed through the first gas dispensing means separate from the second gas dispensing means,
wherein the sum of cross-sectional areas of the orifice(s) of the first gas dispensing means is smaller than the sum of cross-sectional areas of the orifice(s) of the second gas dispensing means.

Such rotating means can be a spin chuck such as a vacuum chuck, a pin chuck or a Bernoulli-chuck or can be rollers which circumferentially touch the disc-like article and drive the disc-like article.

Liquid dispensing means typically comprise a piping liquid pressure means (e.g. a pump or a container located at a higher level) and at least one discharge nozzle with at least one orifice. The discharge nozzle is directed towards the surface of the disc-like article. Preferably during the liquid removal process only one nozzle with one single orifice is used, the nozzle is directed towards the surface so that liquid is dispensed perpendicularly onto the surface. Advantageously a smooth shape of the orifice is selected (e.g. a circular or oval orifice) so that liquid is dispensed onto the disc-like article without splashing.

The means for separately controlling the gas flows of the first and the second gas dispensing means are in one embodiment solenoid valves which are switched by a controller (e.g. computer). Such controller has the information where the liquid and the gas dispensing means are located at a certain moment and thence can decide when the second gas dispensing means can be switched on when the liquid dispensing means passes a certain position. In another embodiment the means for separately controlling can even increase and decrease the gas volume flows.

In a preferred embodiment the moving means for moving the liquid dispensing means and the second gas dispensing means across the disc-like article are configured so that the second gas dispensing means follows the liquid dispensing means. This can be carried out by mounting both the second gas dispensing means and the liquid dispensing means onto the same nozzle assembly or they are mounted on different media arms. Mounting the nozzles on different arms gives the advantage that the distance between the liquid dispensing means and the second gas dispensing means can be varied during the process or from process to process. In this embodiment the first gas dispensing means can be fixed in the centre of rotational movement and thus the first gas dispensing means does not follow the liquid dispensing means.

In yet another embodiment the moving means further comprise means for moving the first dispensing means across the disc-like article so that the first gas dispensing means follows the liquid dispensing means. In this case all three gas dispensing means may be mounted on different arms or may belong to the same nozzle assembly.

The sum of the cross-sectional areas of the orifice of the first and second gas dispensing means have a ratio 1:1.1 to 1:20. A preferred ratio range is 1:2 to 1:10.

Yet another preferred embodiment of the first gas dispensing means has a sum of cross-sectional areas of less than 20 $mm^2$, which results in a small area of impact of the first gas.

The second gas dispensing means preferably has a sum of cross-sectional areas of more than 5 mm², which allows covering a great area with the second gas.

Said second gas dispensing means may comprise a slit-shaped nozzle wherein the slit is substantially perpendicularly arranged to the radius of the rotational movement, whereby the second gas dispensing means dispenses a gas curtain. The term "substantially perpendicular" in this case shall mean a range of 85° to 95°. This configuration can be achieved by a linear movement of the second gas dispensing means when the movement goes through the centre of rotational movement and the slit-shaped nozzle is mounted substantially perpendicular with respect to the linear movement. If the slit-shaped nozzle is mounted on a swivel arm a counter movement of the nozzle has to be carried out in order to maintain the slit-shaped nozzle in a position substantially perpendicularly to the radius of the rotational movement.

As an alternative to the slit-shaped nozzle the second gas dispensing means may comprise an array of nozzles which are arranged in a substantially straight line. This line is substantially perpendicular to the moving direction of the second gas dispensing means, whereby the nozzles dispense a gas curtain.

Furthermore the second gas dispensing means and the liquid dispensing means may be fixed to each other with a distance d2 between the second gas dispensing means and the liquid dispensing means.

The alignment of the first gas dispensing means, the second gas dispensing means and the liquid dispensing means is fixed to each other with a distance d1 between the first gas dispensing means and the liquid dispensing means.

Preferably the difference of distance d2 and the distance d1 (d2−d1) should range from −1 cm to +1 cm.

A second aspect of the invention is a method for removing liquid from a surface of a disc-like article comprising:
  rotating the disc-like article about an axis perpendicular to the disc-like article's main surface
  supplying liquid onto the disc-like article when rotated, wherein the liquid is supplied from a supply port, which is moved across the substrate towards the edge of the disc-like article
  supplying a first gas flow through a first gas supply port onto the disc-like article to an area, wherein the area's centre has a distance to the centre of the rotational movement of not more than 20 mm, wherein the area, to which the first gas is supplied, is covered with a liquid layer when the first gas is supplied, and thereby the liquid layer is opened at a discrete area, and
  supplying a second gas flow through a second gas supply port onto the disc-like article when rotated, wherein the second gas flow is supplied from a second gas supply port, which is moved across the substrate towards the edge of the substrate, wherein the distance of the second gas supply port to the centre is lower than the distance of the liquid supply port to the centre while the second gas flow and the liquid are supplied.

For example the supplying of the second gas flow may start after the first gas flow has started or if the second gas flow is started not after the first gas flow has started the second gas flow is increased after the first gas flow has started. This means that the second gas flow could first be at a very low volume flow 0.2 l/min and is increased at a distance from the centre of e.g. 40 mm to 6 l/min.

In a preferred method the second gas flow is started when the outer edge of the second gas supply port is at a distance to the centre of the rotational movement of at least 20 mm.

Preferably the gas velocity of the first gas flow is at least double of the gas velocity of the second gas flow.

The gas volume flow of the first gas flow may not be more than half of the gas volume flow of the second gas flow.

Advantageously the gas velocity v1 of the first gas flow is minimum 3 m/s. Preferably the gas velocity v2 of the second gas flow is maximum 5 m/s.

In another embodiment the rotation speed decreases when the liquid dispensing means moves towards the edge. However, it could be advantageous if the rotation speed increases e.g. towards the edge.

In a preferred method the moving speed at which the liquid dispensing means moves towards the edge decreases when the liquid dispensing means moves towards the edge.

In order to further improve liquid removal efficiency a substance decreasing the surface tension of a removing liquid is applied either through the removing liquid or through at least the second gas flow or through both the removing liquid and at least the second gas flow.

Such a substance can be called a surface-active substance. However, per definition herein a surface active substance must be a substance capable of lowering the surface energy (surface tension) of water. This does not necessarily mean that it has to be a tenside or surfactant such as soap. It only shall mean that it shall comprise a molecule, which has a polar and an apolar (non-polar) end (e.g. any kind of alcohol).

DESCRIPTION OF THE VIEWS OF THE DRAWINGS

Further details and advantages of the invention shall become apparent by the Figures and the associate description.

DETAILED DESCRIPTION OF THE INVENTION

Figure 1:
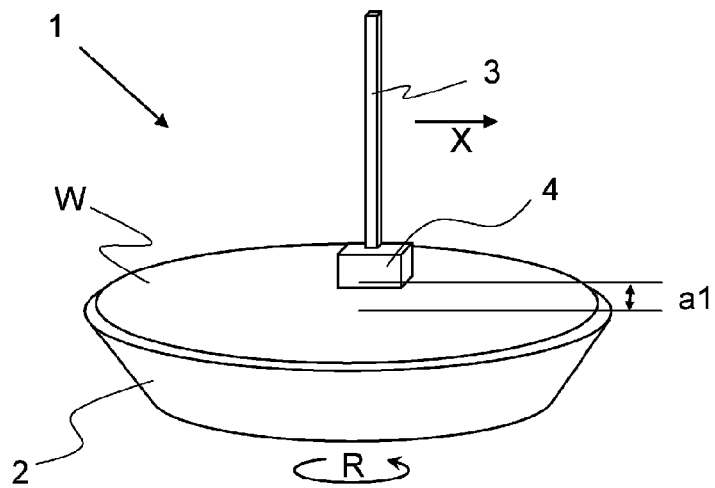
FIG. 1 shows a schematic view of an embodiment of the invention

FIG. 1 shows a device 1 for removing liquid from a surface of a disc-like article W according to a preferred embodiment. The device comprises a spin chuck 2 for holding the disc-like article W and an arm 3, on which a nozzle assembly 4 is mounted. In this case the disc-like article is a semiconductor wafer (wafer). The spin chuck 2 can rotate (shown by arrow R). The nozzle assembly 4 comprises a plurality of nozzles with orifices facing downward. Different fluids are discharged through such nozzles towards the upward facing surface of the wafer. The arm 3 and the nozzle assembly is connected to a moving mechanism (not shown) to move the nozzle assembly 4 across the wafer's surface. The arm 3 could be moved along a straight line (e.g. across a radius, shown by arrow X) or could follow a swivel movement. While moving the nozzle assembly across the wafer a merely constant distance a1 is maintained between the nozzle assembly and the wafer surface. Such distance is optimized depending on the process parameters (e.g. fluid flows, chuck speed) and is selected between 1 mm and 5 cm, preferably between 3 mm and 2 cm. The distance of the nozzle assembly is hereby defined as being the distance of the nozzle orifice, which is closest to the wafer.

Figure 2:
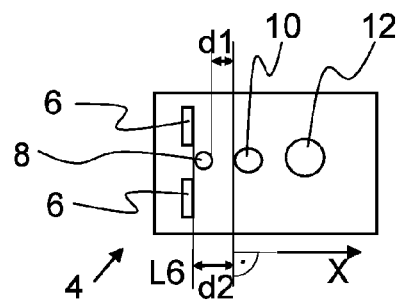
FIG. 2 shows a schematic bottom view of a nozzle configuration in a first embodiment of the invention
Figure 3:
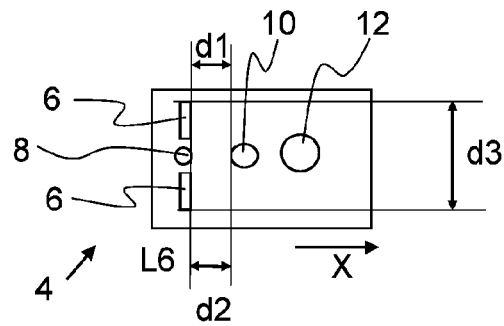
FIG. 3 shows a schematic bottom view of a nozzle configuration in a second embodiment of the invention
Figure 4:
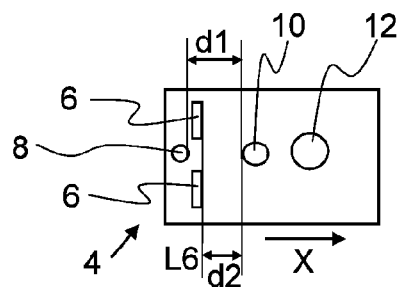
FIG. 4 shows a schematic bottom view of a nozzle configuration in a third embodiment of the invention

FIG. 2, FIG. 3, and FIG. 4 show schematic bottom views of three different embodiments for such nozzle assembly.

FIG. 2 shows a first embodiment of the nozzle assembly with a wetting nozzle 10 for supplying a wetting liquid during the liquid removing process, an opening nozzle 8 for a first gas flow for blowing gas onto a closed liquid layer (when the whole wafer surface is covered with liquid) and thereby opening the liquid layer of wetting liquid, and two curtain nozzles 6 for a second gas flow for providing gas atmosphere.

Optionally the nozzle assembly 4 further comprises a rinsing nozzle 12 for dispensing rinsing liquid (e.g. DI-water) onto the wafer before the liquid removing process is started. This gives the advantage that there is no need of a separate medium arm.

The cross-sectional area of the orifice of opening nozzle 8 is smaller than the sum of cross-sectional areas of the orifices of the curtain nozzles 6. In the shown example the cross sectional area of the opening nozzle's orifice is 8 mm$^2$ (diameter is 3.2 mm) whereas the sum of cross-sectional areas of the two orifices of the curtain nozzles' orifices is 32 mm$^2$ (2×2 mm×8 mm).

If the gas volume flow of the first gas (f1 through opening nozzle 8) and the gas volume flow of the second gas (f2 through curtain nozzles 10) is selected the same (e.g. f1=f2=6 l/min) the gas velocity (v1) of the gas dispensed through the opening nozzle is four times higher than the gas velocity (v2) of the gas dispensed through the curtain nozzle. Therefore the impulse directed toward the liquid layer through the opening nozzle is four times higher than the impulse generated by the curtain nozzles.

The distance d1 describes the distance between opening nozzle's orifice 8 and wetting nozzle's orifice 10.

The distance d2 describes the distance between curtain nozzle's orifices 6 and wetting nozzle's orifice 10. This distance d2 is hereby defined as being the distance between the straight line L6 and the contour of the wetting nozzle 10. The straight line L6 connects the contours of the orifices of the curtain nozzles. The straight line L6 touches the part of the contours of the orifices, which are facing the wetting nozzle 10. In the shown embodiment line L6 is perpendicular to the moving direction. d1 is smaller than d2 (d2−d1=4 mm)

The distance between two nozzles (e.g. d1, d2) shall not be understood as being the distance between the centre of these two nozzles.

Said second gas dispensing means comprises two slit-shaped nozzles, wherein each slit is substantially arranged to the radius of the rotational movement at an angle (a) at a range of 85° to 95° (see FIG. 9), whereby the second gas dispensing means dispenses a gas curtain.

The second embodiment of the nozzle assembly shown in FIG. 3 is based on the first embodiment (FIG. 2) however the nozzle orifices of both the curtain nozzle (line L6) as well as the opening nozzle have the same distance to the wetting nozzle's orifice (d1=d2).

The third embodiment of the nozzle assembly shown in FIG. 4 is based on the first embodiment (FIG. 2) however the nozzle orifices of the curtain nozzle (line L6) is closer to the wetting nozzle's orifice than the opening nozzle's orifice (d1>d2; d2−d1=−4 mm).

Figure 5:
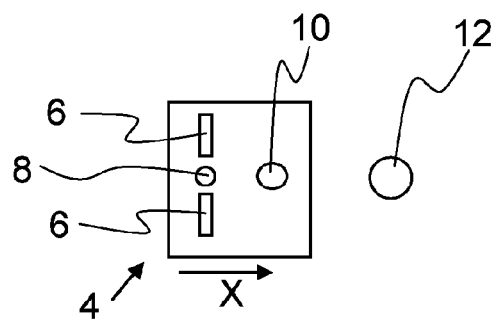
FIG. 5 shows a schematic bottom view of a nozzle configuration in a fourth embodiment of the invention
Figure 6:
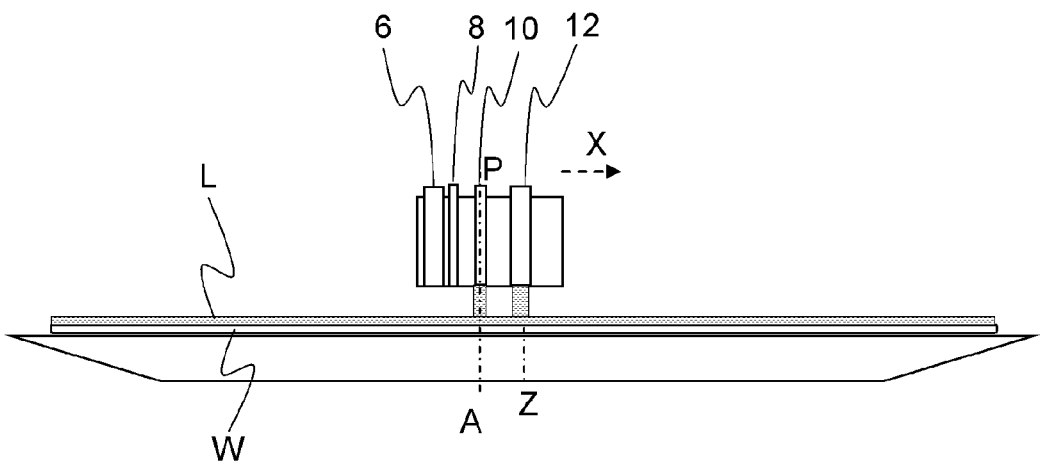
FIG. 6 shows a schematic cross-sectional view of an embodiment of the invention before the nozzle starts the liquid removing in the centre of a semiconductor wafer (wafer)
Figure 7:
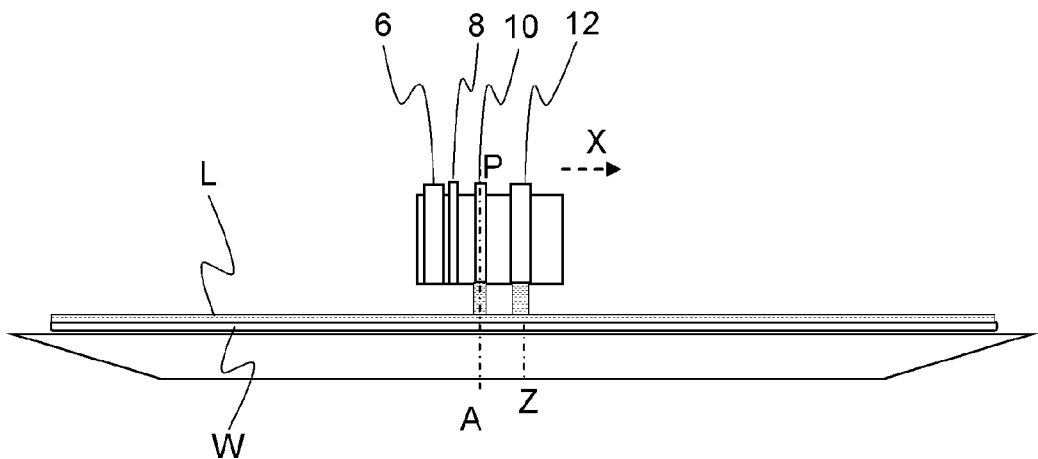
FIG. 7 shows a schematic cross-sectional view of an embodiment of the invention when the nozzle of the first gas dispensing means starts the liquid removing in the centre of a semiconductor wafer (wafer)
Figure 8:
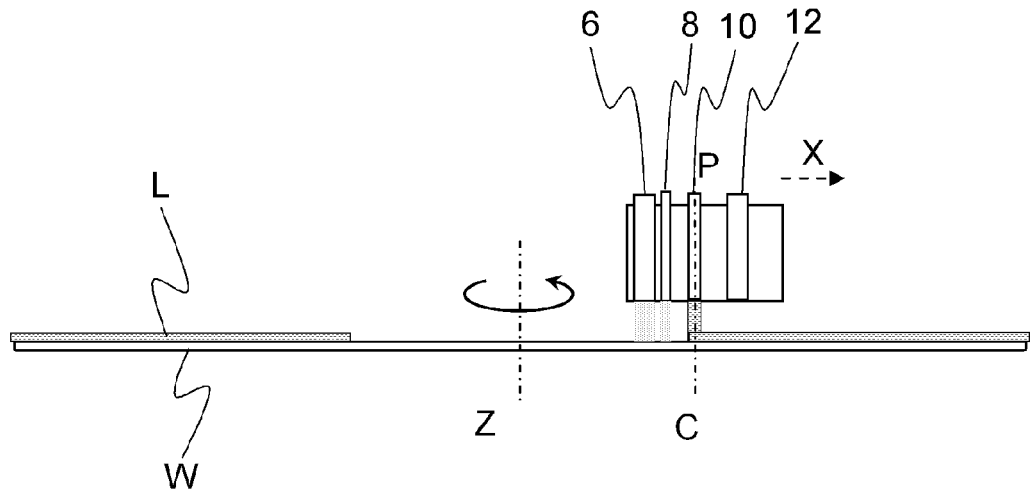
FIG. 8 shows a schematic cross-sectional view of an embodiment of the invention well after the nozzle of the first gas dispensing means has started the liquid removing in the centre of a semiconductor wafer (wafer) and is supported by the second gas dispensing means.

The fourth embodiment of the nozzle assembly shown in FIG. 5 is based on the second embodiment (FIG. 3) however the rinsing nozzle is mounted on a separate arm. Although this leads to a mechanically more complicated solution this gives the advantage that the rinsing nozzle can be removed from the space above the wafer and thus the rinsing nozzle does not interfere with the liquid removing process.

If d2 is at least as big as d1 the distance d1 should be in the range of 0.5 cm to 3 cm. If d1 is at least as big as d2 the distance d2 should be in the range of 0.5 cm to 3 cm.

Based on the first embodiment of the nozzle assembly a process for removing liquid shall be described with reference to FIG. 2, FIG. 6, FIG. 7, FIG. 8 and FIG. 9. Here a wafer with a diameter of 300 mm shall be dried.

Figure 11:
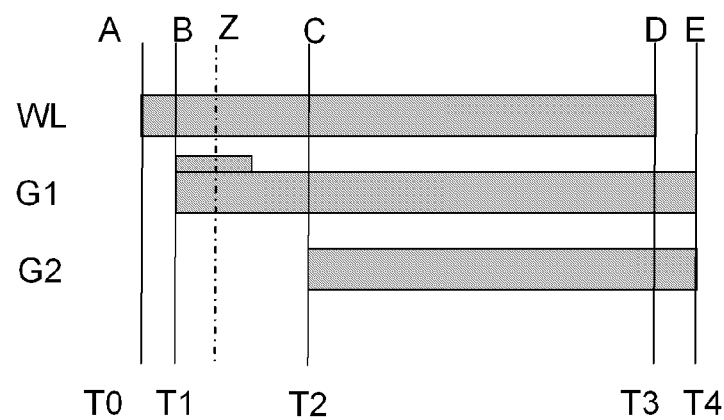
FIG. 11 is a visualization of a method in a second embodiment of the invention with respect to the position of the nozzle over the wafer.

After a cleaning process rinsing liquid is applied to the wafer surface through the rinsing nozzle 12 (at 10 l/min) while the rinsing nozzle my scan across the wafer surface. The rinsing liquid stops at the centre Z (FIG. 6), whereby the wafer surface is kept thoroughly wet. At this position of the nozzle assembly 4 the centre of the wetting nozzle 10 is at position A. The position A is 20 mm before the centre Z with reference to the moving direction of the nozzle assembly 4. In the following the centre P of the wetting nozzle 10 is used as reference position. At position A the wetting liquid (e.g. DI-water) is applied through the wetting nozzle 10 at a volume flow of 0.4 l/min. A cross-sectional area of 4 mm$^2$ results in a wetting liquid velocity of 2.5 m/s. The rinsing liquid is switched off when the wetting liquid is switched on in position A (see FIG. 6). The nozzle assembly is moved over the centre Z of the rotational movement (R) across the wafer at a speed of about 5 mm/s so that the nozzle is held in a position where the opening nozzle 8 is closer to the centre Z after the opening nozzle has passed the centre Z. The first gas flow is switched on before the opening nozzle 8 has reached the centre Z but after the wetting nozzle 10 has passed the centre Z whereby the liquid layer L is initially opened around the centre (see FIG. 7). The gas volume flow dispensed through the opening nozzle is f1 6 l/min (100 cm$^3$/s). In order to further support the opening of the liquid layer f1 can be selected even higher just for a starting phase of 5 s (e.g. 10 l/min) (visualized in FIG. 11).

The nozzle assembly 4 is further moved towards the wafer edge. The liquid flow of the wetting liquid and the first gas flow are kept constant and thus a smooth liquid/gas boundary layer is established, which is slowly moved towards the wafer edge with the movement of the nozzle assembly. When the centre of the wetting nozzle P has a distance to the rotation centre Z of 50 mm (Position C, see FIG. 8) the curtain nozzle 6 is switched on, whereby a broader area of the boundary layer is supplied with gas. Optionally the gas flow of the opening nozzle can be stopped or lowered. When it is lowered it can be lowered to a gas volume flow, which is a fourth of the gas volume flow of the second gas flow. Consequently the gas velocity of the first gas flow would than match with the gas velocity of the second gas flow. When the wetting nozzle reaches position D, which is 140 mm from the centre Z wetting liquid is switched off (the opening nozzle then is at a distance of 130 mm from the centre). When the wetting nozzle reaches position E, which is 160 mm from the centre Z both gas flows are switched off (the opening nozzle then is at a distance of 150 mm from the centre—the wafer's edge).

In order to further support the establishment of a smooth boundary layer a surface energy influencing medium (e.g. 2-propanol) can be entered to the system either trough one of the gas flows (or both gas flows) or through the wetting liquid or through both, the wetting liquid and the gas flow(s).

Figure 10:
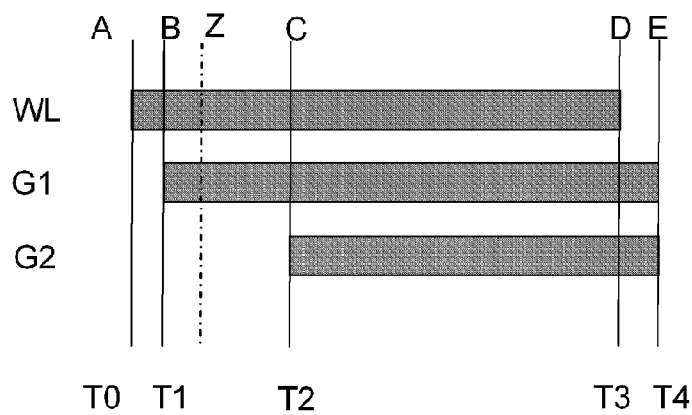
FIG. 10 is a visualization of a method in a first embodiment of the invention with respect to the position of the nozzle over the wafer, and with respect to the time of supplying liquid, first gas and second gas onto the wafer.

Table 1 and table 2 summarize the described process example, which is visualized in FIG. 10.

TABLE 1

| Position P | Action | Distance to Centre PZ = r | | |
|---|---|---|---|---|
| A | switch on wetting liquid | −20 mm | T0 | 0 s |
| B | switch on gas 1 | 5 mm | T1 | 5 s |
| C | switch on gas 2 | 50 mm | T2 | 14 s |
| D | switch off wetting liquid | 140 mm | T3 | 32 s |
| E | switch off gas 1 and 2 | 160 mm | T4 | 36 s |

TABLE 2

| | |
|---|---|
| rotation velocity w: | 300-600 rpm |
| wetting liquid volume flow: | 0.4 l/min |
| moving speed of nozzle assembly m: | 5 mm/s |
| cross sectional area of opening nozzle (3.2 mm diameter of the orifice): | 8 mm$^2$ = 0.08 cm$^2$ |
| gas volume flow f1 : | 6 l/min (100 cm$^3$/s) |
| gas velocity v1 : | 12.5 m/s |
| cross sectional area of curtain nozzles together (2 × 8 mm × 2 mm): | 32 mm$^2$ = 0.32 cm$^2$ |
| gas volume flow f2: | 6 l/min (100 cm$^3$/s) |
| gas velocity v2: | 3.13 m/s |

To further support the liquid removing process it is desirable to keep the circumferential velocity at the point of impact of the wetting liquid constant. For instance from the centre until position C (in the above example ZC is 50 mm) the rotation speed is kept constant at 300 rpm. The circumferential velocity (vc(r)) at the point of impact P of the wetting liquid thus increases from 0 m/s to 2.36 m/s.

Thereafter the rotational speed should be adjusted in dependency on the distance r of the position P of the centre of the wetting nozzle 10 described by the following formula:

$$w(r) = w1 * r1/r$$

wherein w1 ... is a basis rotational speed, r1 ... is the distance of the point of impact to the rotational centre from which onward the circumferential speed shall be kept constant This means that when the wetting nozzle has a distance of 100 mm to the rotational centre, the rotational speed shall be 150 rpm and at the edge (r=150 mm) the rotational speed shall be 100 rpm.

It is furthermore desirable that the moving speed m has to be decelerated the farther the nozzle moves outward. For instance the moving speed from centre to position C is 12 mm/s and is lowered thereafter. E.g. at r=100 mm should be m=6 mm/s and at r=150 mm m=4 mm/s.

−1 cm<d2−d1<+1 cm preferred d1−d2=0

Figure 9:
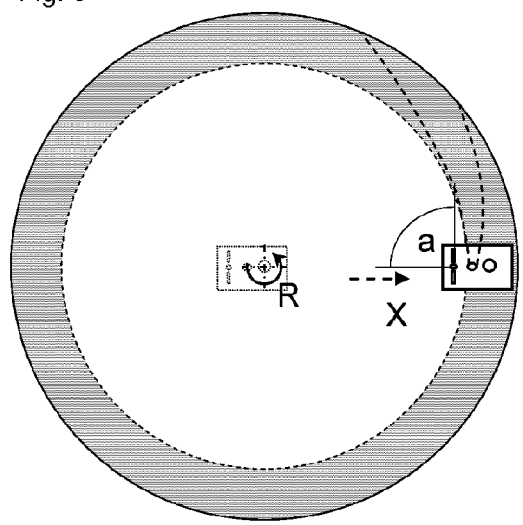
FIG. 9 shows a schematic top view of an embodiment of the invention well after the nozzle of the first gas dispensing means has started the liquid removing in the centre of a semiconductor wafer (wafer) and is supported by the second gas dispensing means.

FIG. 9 shows a schematic top view of an embodiment of the invention well after the nozzle of the first gas dispensing means has started the liquid removing in the centre of a semiconductor wafer (wafer) and is supported by the second gas dispensing means. The nozzle assembly shown in dotted lines at the rotational centre indicates where the movement (indicated by arrow X) of the nozzle assembly had started.

For the above described example the surface active substance is added to the second gas flow at a concentration of 1500 ppm 2-propanol in nitrogen as a carrier gas.

Alternatively the surface active substance (2-propanol) can be added to the wetting liquid (DI-water) at a concentration of 20% per weight. In this case the moving speed m of the nozzle assembly is selected at 2 mm/s.

In an alternative example the wafer is held up-side-down on a spin chuck, which means that liquids and gas are supplied to the wafer from below. Alternatively both sides of the wafer can be dried simultaneously by using the same method e.g. with a spin chuck as disclosed in U.S. Pat. No. 6,536,454B2.

What is claimed is:

1. Method for removing a liquid layer from a main surface of a disc-like article comprising:
   rotating the disc-like article about an axis perpendicular to the disc-like article's main surface,
   supplying liquid onto the rotating disc-like article from a liquid supply port which is moved across the main surface and toward the edge of the disc-like article,
   supplying a first gas flow through a first gas supply port onto the rotating disc-like article, thereby opening the liquid layer at a discrete area, wherein the first gas supply port is moved across the main surface and toward the edge of the disc-like article in the same direction as the liquid supply port, and
   supplying a second gas flow onto the rotating disk-like article through a second gas supply port which is moved across the main surface and toward the edge of the disc-like article in the same direction as the liquid supply port, wherein:
   the step of supplying liquid is commenced at a location which is before the center of the main surface relative to the moving direction of the liquid supply port and continued as the liquid supply port is moved across the main surface,
   after the step of supplying liquid is commenced, the step of supplying a first gas flow is commenced at a location which is before the center of the main surface relative to the moving direction of the liquid supply port, and
   after the step of supplying a first gas flow is commenced, the step of supplying a second gas flow is commenced at a location which is after the center of the main surface relative to the moving direction of the liquid supply port and continued as the second gas supply port is moved across the main surface.

2. Method according to claim 1 wherein the first gas flow is commenced at a gas velocity which is at least double the gas velocity at which the second gas flow is commenced.

3. Method according to claim 2 wherein the second gas flow is commenced at a location which is after the center of the main surface by increasing the volume flow of the second gas flow.

4. Method according to claim 1 wherein, when the second gas flow is commenced, the first gas flow is ceased or reduced to a gas velocity equal to that of the second gas flow.

5. Method according to claim 1 wherein the second gas flow is commenced when a center of the liquid supply port is at a location which is 50 mm from the center of the main surface.

6. Method according to claim 1 wherein the step of rotating the disk-like article comprises maintaining a constant circumferential velocity at different locations of the liquid supply port.

7. Method according to claim 6 wherein the circumferential velocity is maintained constant only after the second gas flow is commenced.

8. Method according to claim 1 wherein a surface energy influencing substance is provided through the liquid supply port, the first gas supply port or the second gas supply port.

* * * * *